(12) United States Patent
Voznesenskiy et al.

(10) Patent No.: US 10,204,197 B2
(45) Date of Patent: Feb. 12, 2019

(54) COUPLED-DOMAINS DISTURBANCE MATRIX GENERATION FOR FAST SIMULATION OF WAFER TOPOGRAPHY PROXIMITY EFFECTS

(71) Applicant: Synopsys, Inc., Mountain View, CA (US)

(72) Inventors: Nikolay B. Voznesenskiy, Tartu (EE); Ralf Juengling, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 81 days.

(21) Appl. No.: 15/339,447

(22) Filed: Oct. 31, 2016

(65) Prior Publication Data

US 2018/0121586 A1 May 3, 2018

(51) Int. Cl.
*G06F 17/50* (2006.01)

(52) U.S. Cl.
CPC ...... *G06F 17/5036* (2013.01); *G06F 17/5081* (2013.01)

(58) Field of Classification Search
USPC .......................................................... 716/51
See application file for complete search history.

(56) References Cited

U.S. PATENT DOCUMENTS 6,397,171 B1 *  5/2002  Belk ................. G06F 17/5036
                                                              703/14
8,045,787 B2  10/2011  Choi et al.
2005/0283747 A1  12/2005  Adam
2007/0082281 A1   4/2007  Melvin et al.
2009/0070730 A1   3/2009  Zhang et al.
2011/0029940 A1   2/2011  Song et al.
2011/0252387 A1  10/2011  Liu et al.

OTHER PUBLICATIONS

Liu et al. "A full-chip 3D computational lithography framework", Optical Microlithography XXV, Proc. of SPIE, vol. 8326, 83260A (Feb. 21, 2012), 18 pages.

(Continued)

*Primary Examiner* — Bryce M Aisaka
(74) *Attorney, Agent, or Firm* — Bever, Hoffman & Harms, LLP

(57) ABSTRACT

A coupled-domains method for generating disturbance matrices used in correcting topography proximity effects (TPE) for integrated circuit (IC) designs that include inhomogeneous substrates. The IC design is modeled and divided into domains (z-direction regions), each domain defined by upper/lower horizontal domain boundaries and optical properties generated by its associated geometry and material composition. Fourier-space representations are utilized to determine discrete electrical and magnetic field components for each domain that are integrated to derive domain transfer matrices, which are then multiplied to produce a total transfer matrix, which is then used to generate the disturbance matrix. The disturbance matrix may then be utilized by a model-based mask correction tool to calculate light intensity values in the photoresist layer. The corrected mask design is then used to generate a physical mask utilized in the subsequent fabrication of an IC device based on the IC design.

13 Claims, 9 Drawing Sheets

(56) References Cited

OTHER PUBLICATIONS

Song et al. "Wafer Topography Proximity Effect Modeling and Correction for Implant Layer Patterning", Photomask Technology, Proc. of SPIE, vol. 7488, 74883F (Sep. 23, 2009), 9 pages.

Voznesenskiy et al.: "Large Scale Model of Wafer Topography Effects", Optical Microlithography XXIV, Proc. of SPIE, vol. 7973, 79732G (Mar. 22, 2011), 8 pages.

Zhang et al. E.K.G. "Compact and accurate wafer topography proximity effect modeling for full chip simulation" U.S. Pat. No. 8,719,736, May 2014.

Guilmeau et al. "Evaluation of wet-developable KrF organic BARC to improve CD uniformity for implant application." Proc. SPIE (2004), vol. 5376, pp. 461-470.

Songyi et al. "Model based OPC for implant layer patterning considering wafer topography proximity (W3D) effects." SPIE Advanced Lithography. International Society for Optics and Photonics, 2012.

Oh et al. "Full-chip correction of implant layer accounting for underlying topography." SPIE Advanced Lithography. International Society for Optics and Photonics, 2012.

\* cited by examiner

COUPLED-DOMAINS DISTURBANCE MATRIX GENERATION FOR FAST SIMULATION OF WAFER TOPOGRAPHY PROXIMITY EFFECTS

BACKGROUND

Photoresist is a light-sensitive material used in photolithography to form a patterned layer on a surface. In a positive resist, the portion of the photoresist that is exposed to light becomes soluble to a photoresist developer. The portion of the photoresist that is unexposed remains insoluble to the photoresist developer. In a negative resist, the portion of the photoresist that is exposed to light becomes insoluble to the photoresist developer. The portion of the photoresist that is unexposed is dissolved by the photoresist developer. The light used for developing photoresist includes ultraviolet (UV) or deep UV (DUV) light, wherein shorter wavelengths allow an increased resolution and hence a smaller minimum feature size to be achieved. The patterned photoresist is used to synthesize structures in or on the underlying semiconductor layer. Thus, the fidelity of the patterned resist directly affects the resulting geometry of the underlying layer.

Light scattering from non-planar wafer topography substrates can cause light exposure in photoresist areas normally unexposed. FIG. 10 illustrates an exemplary substrate 51 including a plurality of non-planar topographic features. These features include a shallow trench isolation (STI) area 52A and a polysilicon feature 54A, each of which can reflect light at different angles and affect the exposure of a desired patterned resist feature 53A. This scattered light tends to cause disruptions in pattern fidelity of the photoresist. These disruptions are called wafer substrate topography proximity effects (TPE) in the industry. For example, in the case of patterned resist 53A, the scattered light from STI 52A and polysilicon features 54A may result in a different critical dimension (CD) at the bottom than at the top. This CD variation may undesirably affect the CD transferred to the underlying area during a subsequent process step.

Note that state-of-the-art integrated circuit (IC) designs are increasingly complex. Therefore, dense patterns rather than sparse patterns are increasingly prevalent in IC designs. For dense patterns, the wafer topography sensitivity of the photoresist CD appears to be more pronounced compared to sparse patterns due to the scattering of light described above. Therefore, the TPE problem is expected to worsen as IC designs continue to evolve in complexity.

TPE has been ignored for 45 nm and larger node technologies due to its relatively small impact to pattern CDs. For smaller node technologies, bottom anti-reflective coatings (BARCs) have been used in conjunction with photoresists to mitigate TPE. However, for an implant layer patterning step, BARC is not a preferred solution due to increased implant process complexity. Therefore, for 32 nm and 28 nm node technologies, rule-based correction or model-based correction of TPE-induced CD variations can be used for the implant layer. However, for 20 nm node and below technologies, even more accurate TPE modeling becomes both desirable and necessary.

There are two simultaneously necessary but often contradictory requirements for any computational tools used to simulate TPE. One requirement is that the simulation of the photolithography process is accurate and reliable in predicting the final shape of developed photoresist. The other requirement is rapid execution of the simulation in order to make applications like model-based optical proximity correction and full-chip lithography rule checking practical. The phrase "fast simulation" is utilized herein to describe simulated photolithography effect processes when the second requirement is met (i.e., when full-chip model-based optical proximity correction and lithography rule checking can be completed within a few days).

Tools to simulate photolithography effects are currently available. For example, the Sentaurus™ lithography (S-Litho™) tool provided by Synopsys, Inc. can accurately simulate wafer substrate topography proximity effects by solving Maxwell's equations. As known by those skilled in the art, Maxwell's equations are a set of partial differential equations that, together with the Lorentz force law, provide the rudiments of accurately estimating optical effects, including photolithography. Unfortunately, this approach is computationally intensive, and therefore has long runtimes. As a result, this approach is not a fast simulator and is unsuitable for full-chip applications.

U.S. Pat. No. 8,719,736 entitled "Compact and accurate wafer topography proximity effect modeling for full chip simulation" (incorporated herein by reference in its entirety) discloses a methodology for composing a disturbance matrix from pre-computed T-matrices (i.e., transfer matrices). The T-matrices are generated for preselected layout descriptions by solving Maxwell's equations using rigorous computing techniques, which are impractical for fast simulation applications, and then the preselected layout descriptions and associated pre-computed T-matrices are stored in a library. During operation of the methodology proposed in the '736 patent, a disturbance matrix is generated for a selected circuit design region by dividing the circuit design region into component layout description pieces that are then matched with the preselected layout descriptions stored in the library, and the pre-computed T-matrices stored with the associated preselected layout descriptions are utilized to compute the disturbance matrix for the selected circuit design region. Mathematically, each disturbance matrix functions to calculate E-field disturbances caused by the particular optical properties of the structure materials (e.g., refraction index, absorption coefficient, etc.) forming a circuit design region in response to an incident E-field at a given incidence angle. These disturbance matrices are utilized, for example, in standard model-based mask correction tools that perform TPE correction by way of modeling incident light directed through a selected mask design and onto a photoresist layer. The disturbance matrices are used by the model-based mask correction tools to calculate light intensities at selected points in the photoresist layer caused by the underlying circuit design features, and then the calculated light intensities are used to detect regions experiencing problematic light intensities (e.g., regions where high light intensities produce undesirable photoresist development), and to provide mask design corrections designed to alleviate the problematic light intensity conditions. Although the T-Matrix library approach works well when the library contains layout descriptions that match all of the component layout description pieces, substantial delays are encountered with a suitable match cannot be found. Moreover, it is difficult to know ahead of time all layout descriptions that will be needed for a given circuit design, and it may be impractical to generate pre-computed T-matrices for all possible layout configurations.

What is needed is a method for calculating light intensity values generated in a photoresist layer during a model-based mask correction process that both qualifies for fast simulation and avoids the deficiencies of the prior art approaches set forth above. In particular, what is needed is a method for rapidly generating a disturbance matrix that can be used to accurately describe light intensity values inside a photoresist layer formed over an inhomogeneous substrate without the use of pre-computed T-matrices stored in a library.

SUMMARY

The present invention is directed to a coupled-domains method that utilizes Fourier-space representations of electric and magnetic field components to rapidly generate disturbance matrices for IC designs having inhomogeneous substrates. The use of Fourier-space representations of the field components allows for a greatly simplified (more compact) numerical representation because the incident field's transverse components are band-limited by IC fabrication imaging systems. That is, by utilizing Fourier-space representations in combination with additional simplifications afforded by hallmarks of the light scattering problem (discussed below), the coupled-domains method facilitates rapid calculation (i.e., reduces processor computation time) of disturbance matrices by way of utilizing greatly simplified derivations of Maxwell's equations. Moreover, the coupled-domains method can be performed on any inhomogeneous substrate layout description, thereby avoiding the need for pre-computed T-matrices, which further reduces processor computation time. The coupled-domains method also facilitates fast simulation by way of rapidly generating highly accurate disturbance matrices in a form that is usable, for example, by existing model-based mask correction tools to perform TPE correction, whereby the model-based mask correction computation time may be reduced. The present invention thus reduces total manufacturing costs associated with the fabrication of IC devices (chips) based on the IC design by way of reducing the cost of fabricating suitable physical masks used during subsequent photolithographic semiconductor fabrication.

According to an aspect of the invention, the coupled-domains method exploits two important hallmarks of the light scattering problem in order to generate disturbance matrices in a reasonably short computational time period (i.e., a few days or less for a full-chip IC design). First, the incident field consists of plane-wave components with wave vectors falling inside a cone of narrow solid angle, with the cone's axis of symmetry aligned with the main direction of the incident electromagnetic (light) field. This special case is utilized by the coupled-domains method to reduce computational time by minimizing the range of computed incidence angles, whereby highly accurate results are provided in substantially less computing time (i.e., the coupled-domains method reduces processing time). Second, the main direction of the incident field is oriented normal to most of the material interfaces present in the scattering substrate. This second hallmark is exploited by way of characterizing all horizontally oriented material interfaces (i.e., the upper and lower surfaces of the layers and structures defined by the IC design that collectively form the inhomogeneous substrate) as horizontal planar interfaces that are perpendicular to the main direction of the incident light, which facilitates further simplifications of the equations derived from Maxwell's equations, and utilized by the coupled-domains method, which further reduces computation time.

The coupled-domains method begins by generating a three-dimensional (3D) substrate description based on a target IC design, and then the 3D substrate description is divided into vertically arranged domains, where each domain is defined by a volume located between two (top and bottom) planar horizontal boundaries. According to an aspect of the invention, the domain boundaries are generated such that each horizontal interface of the 3D substrate description coincides with a corresponding domain boundary, which serves to simplify the process of generating a total disturbance matrix for the inhomogeneous substrate by facilitating, for each domain, calculating a domain-specific matrix based on a derivation of Maxwell's equations, and then converting each calculated domain-specific matrix into a corresponding domain transfer matrix. When domain transfer matrices are generated or otherwise obtained for every domain, the domain transfer matrices are multiplied together, thereby producing a total transfer matrix for the inhomogeneous substrate. The total transfer matrix is then utilized to determine the desired total disturbance matrix, which in turn is utilized to compute the total reflected electric field values on the upper photoresist surface due to TPE characteristics of the inhomogeneous substrate.

According to an embodiment of the present invention, the coupled-domains method is utilized in conjunction with known wave propagation processing methods to calculate light intensity values generated in a photoresist layer during a model-based mask correction process. The coupled-domains method is utilized to generate a disturbance matrix for a selected IC design using the above-described steps, and then wave propagation is performed using the disturbance matrix and an incident light pattern generated using an initial mask design. The initial mask design is then modified as needed based on light intensity values computed using said wave propagation, and then the modified mask design is used to generate a physical mask using known techniques, which is then used during photolithographic fabrication of a physical IC device based on the selected IC design.

According to another embodiment of the present invention, the coupled-domains method is modified for domains including only one-dimensional structure patterns, thereby reducing processing time.

According to another embodiment of the present invention, the coupled-domains method is modified to utilize domain transfer matrices stored in a library whenever a selected domain's geometry and material composition match those of a previously processed domain, whereby the domain transfer matrix previously computed may be read from the library in order to reduce processing time (i.e., by avoiding computation using the coupled-domains method, described above).

A non-transitory, computer-readable medium storing computer-executable instructions for generating D-Matrices using the coupled-domains method is also described. These instructions when executed by a processor cause the processor to execute a process comprising the above-described steps.

DETAILED DESCRIPTION OF THE DRAWINGS

The present invention relates to an improved method for accurately and rapidly simulating the effects of optical scattering from inhomogeneous substrate underlying a photoresist layer. The following description is presented to enable one of ordinary skill in the art to make and use the invention as provided in the context of a particular application and its requirements. As used herein, directional terms such as "upper", "upward-facing", "lower", "downward-facing", "top", "bottom", "horizontal" and "vertical" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
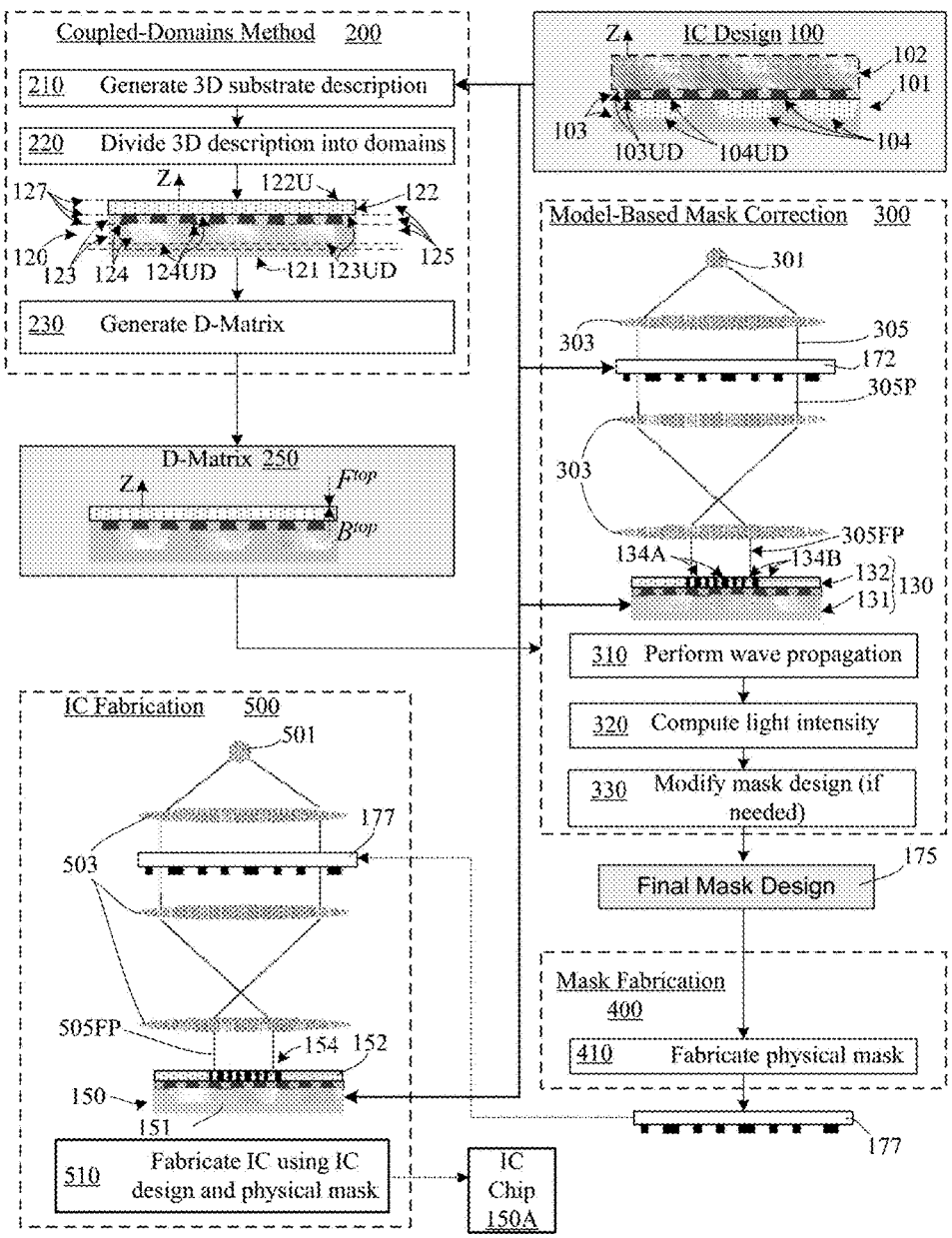
FIG. 1 illustrates a process for generating an IC device using the coupled-domains method of the present invention.
Figure 2:
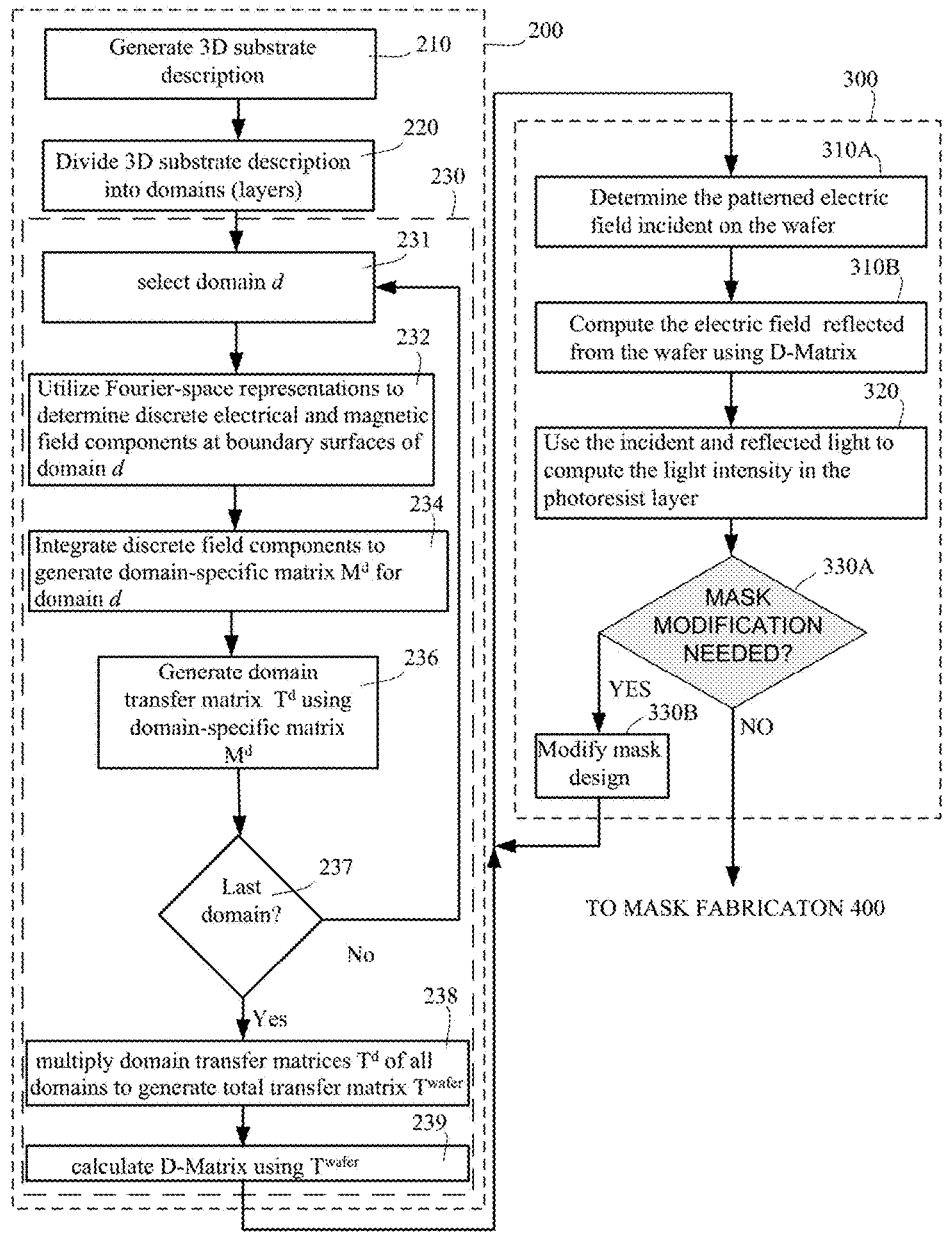
FIG. 2 is a flow diagram depicting the coupled-domains method and model-based mask correction processes of FIG. 1 in additional detail.

The coupled-domains method of the present invention is described below with primary reference to FIGS. 1 and 2. FIG. 1 is a diagram illustrating various tools and systems utilized to generate a physical IC device (chip) 150A based on an IC design 100 according to an exemplary embodiment of the present invention. That is, FIG. 1 depicts in a simplified manner coupled-domains method 200 of the present invention, which is utilized to generate a disturbance matrix (D-Matrix) 250 in the manner set forth below. FIG. 1 also illustrates how D-Matrix 250 may be subsequently utilized in the fabrication of IC chip 150A using a model-based mask correction tool 300, a mask fabrication system 400, and an IC fabrication system 500. FIG. 2 is a flow diagram setting forth additional features of coupled-domains method 200 and model-based correction process 300 of FIG. 1, and provides a method for calculating light intensity values generated in a photoresist layer according to an alternative embodiment of the present invention. Because some details of coupled-domains method 200 are depicted only in FIG. 2, the description below references both figures.

IC design 100, depicted in the top right corner of FIG. 1, includes a computer-generated layout description (also known IC layout, IC mask layout, or mask design) including various conductive, semi-conductive and non-conductive materials that make up the components of associated finished IC device 150A. As known in the art, IC chips are fabricated using a series of fabrication process steps during which various materials are deposited and patterned over a base (typically monocrystalline silicon) substrate, where each material patterning process is achieved by way of exposing an associated photoresist layer to incident light passed through (patterned by) photolithographic reticles (masks), developing the photoresist material to generate a patterned photoresist layer, and then processing (e.g., etching) the underlying material to generate the desired patterned material features. The coupled-domains methods and light intensity calculation methods set forth below are typically repeated many times (e.g., for several masks utilized by IC fabrication system 500 during the production of IC chip 150A), particularly for stages of the in-process IC device where sufficient layers and structures are present to form an inhomogeneous substrate, as explained below. Accordingly, for descriptive purposes, IC design 100 is depicted in FIG. 1 at a representative production state including an inhomogeneous substrate 101, and subsequent processing required to complete IC device 150A is indicated by the dashed-lined box 102 disposed over inhomogeneous substrate 101. As used herein, the phrase "inhomogeneous substrate" refers to a partially formed integrated circuit including multiple different materials forming two or more material material layers 103 and two or more structures 104. Inhomogeneous substrate 101 thus represents a partially formed portion of finished IC device 150A that exists during the fabrication process at a point prior to processing by way of a patterned photoresist mask. As used herein, the phrase "material interface" refers to boundaries between the different materials forming layers 103 and structures 104 of inhomogeneous substrate 101 (e.g., the monocrystalline silicon forming the base layer, polycrystalline silicon forming gate and conductive structures, various dielectric (oxide) materials, metals, etc.).

Referring to the top-left corner of FIG. 1, coupled-domains method 200 generally includes (block 210) generating a three-dimensional (3D) substrate description 120, (block 220) dividing 3D description 200 into domains, and then (block 230) generating a disturbance matrix (D-Matrix) 250 using the novel techniques as set forth below.

As indicated in FIG. 1, generating 3D substrate description 120 generally involves replicating inhomogeneous substrate 101 of IC design 100 such that 3D substrate description 120 includes a modeled inhomogeneous substrate 121 including modeled layers 123 and modeled structures 124 that generally replicate the position and material descriptions of corresponding layers 103 and structures 104 of inhomogeneous substrate 101. In one embodiment, generating 3D substrate description 120 further includes forming a modeled photoresist layer 122 on and uppermost surface of modeled inhomogeneous substrate 121.

Figure 3:
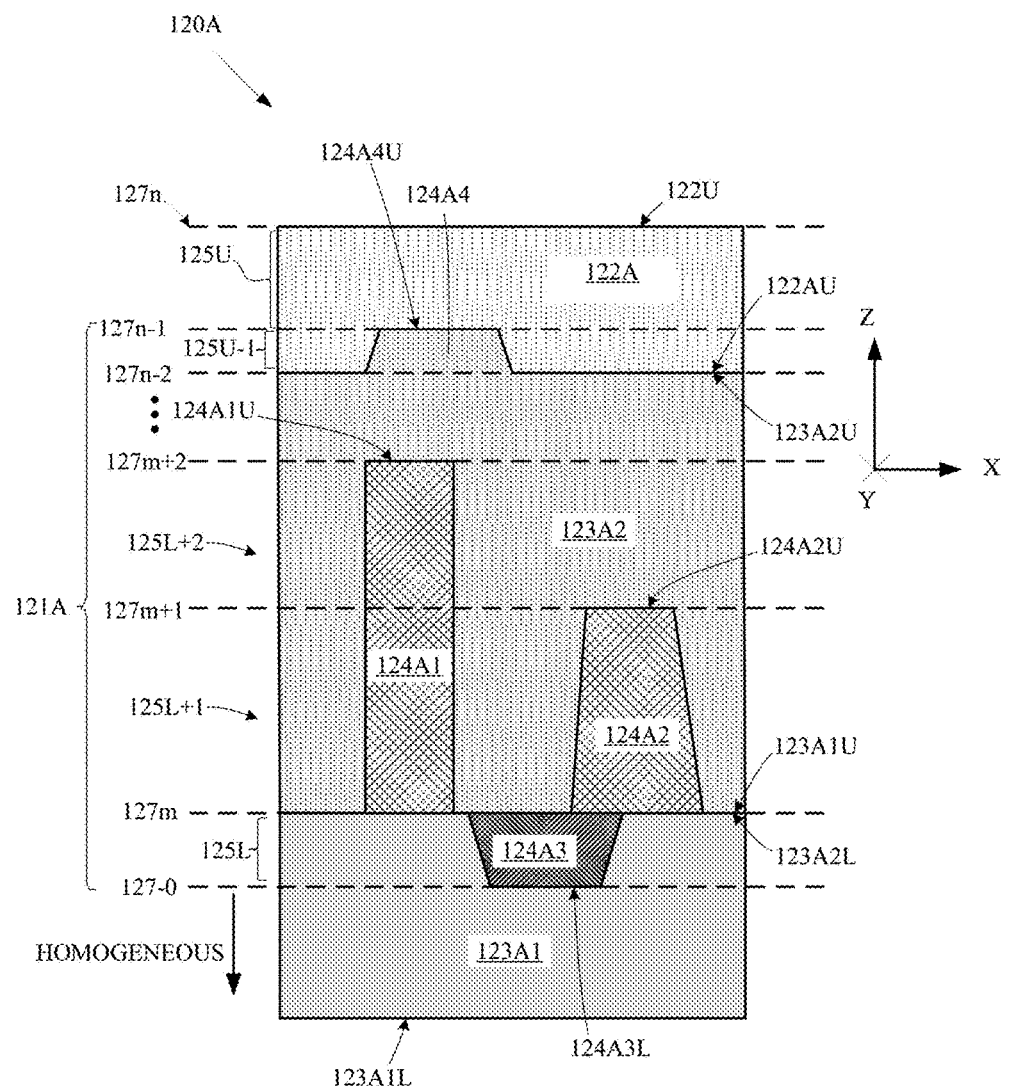
FIG. 3 is a side view depicting a simplified exemplary 3D substrate description including an inhomogeneous substrate underlying a photoresist layer, and depicting domain boundaries generated by horizontal material interfaces that are defined by the various structures according to an embodiment of the present invention.

In one embodiment, all upward-facing and downward-facing material interface regions (collectively referred to herein as upward/downward-facing material interfaces) 123UD and 124UD of modeled layers 123 and modeled structure 124 are modeled using planar and horizontal features (i.e., planar horizontal interfaces) to simplify calculations associated with generating D-Matrix 250. FIG. 3 shows an exemplary simplified 3D substrate description 120A including a base semiconductor substrate layer 125A1 comprising a first material (e.g., monocrystalline silicon), a dielectric layer 123A2 disposed on base substrate 123A1 and comprising a second material (e.g., a dielectric material), and several structures that are formed by additional materials disposed on or formed by layers 123A1 and 123A2 (e.g., polysilicon layers 124A1 and 123A2 formed on an upper surface 123A1U of base substrate 123A1 and extending into dielectric layer 123A2, and a shallow-trench isolation structure 124A3 formed into base substrate 123A1). Additional "structures" may be formed by patterned portions of the layer material (e.g., patterned dielectric region 124A4 extends above upper dielectric surface 123A2U into photoresist layer 122A). The upward-facing and downward-facing surfaces of each of these layers/structures are defined by associated horizontal interfaces, even if the corresponding surfaces of inhomogeneous substrate 101 may not be planar horizontal surfaces. This simplification causes 3D substrate description 120 to include planar horizontal interfaces at each corresponding transition between two materials. For example, 3D substrate description 120 defines the upward/downward-facing material interfaces between adjacent layers using horizontal material interfaces (e.g., upper photoresist surface 122U is defined as a first planar horizontal interface, the substrate/dielectric interface formed at upper substrate surface 123A1U and lower dielectric surface 123A2L forms a second horizontal interface, and the dielectric/photoresist interface formed at upper dielectric surface 123A2U and lower photoresist surface 122AL forms a third horizontal interface. In addition, all upward-facing and downward-facing surfaces of structures 124A1 to 124A4 are also modeled as horizontal planar interfaces. For example, upward facing surfaces 124A1U and 124A2U of polycrystalline silicon structures 124A1 and 124A2, respectively, and downward-facing surface 124A3L of shallow trench isolation (STI) structure 124A3 are also defined by corresponding planar horizontal interfaces.

Referring again to block 220 and 3D substrate description 120 in FIG. 1, dividing 3D substrate description 120 into domains involves forming vertically arranged (stacked in the Z-axis direction) domains 125 separated by horizontal planar domain boundaries 127. As explained below, dividing 3D substrate 120 into domains simplifies the process of generating D-Matrix 250 by way of separating modeled inhomogeneous substrate 121 into layers having different optical properties, thereby facilitating the use of Maxwell's equations to determine disturbances caused at each layer. According to an aspect of the invention, each domain includes associated optical properties that are determined by the particular geometric arrangement and material or materials corresponding to a modeled structure and/or a modeled layer disposed in that domain. For example, referring to FIG. 4, a domain 125B is defined between a top (upper) domain boundary 127T and a bottom (lower) domain boundary 127B, with the intervening volume including a structure 104B disposed between two layer sections 103B1 and 103B2. With this whereby domain 125B is defined by the particular optical properties (e.g., refraction index, absorption coefficient, etc.) of the material compositions forming structure 104B and layer sections 103B1 and 103B2, and by the thickness and size and placement of structure 104B and layer sections 103B1 and 103B2. Other domains may only include one material, or may include many materials disposed in a complicated arrangement. In each case, the optical properties of the domain are calculated using known techniques based on the geometric arrangement and material composition of the structures and/or layers making up the domain.

According to an aspect of the invention, domain boundaries 127 are generated at each Z-axis location in which one or more planar horizontal interfaces are present, and domains 125 are formed by the material disposed between each adjacent pair of domain boundaries 127. For example, referring to the upper portion of FIG. 3, an uppermost domain boundary 127n coincides with upper photoresist surface 122U, and the next domain boundary 127n-1 below boundary 127n coincides with the upward/downward-facing material interface formed by upper surface 124A4U of structure 124A4, whereby an uppermost (top) domain 125U is formed between domain boundaries 127n and 127n-1. A second domain 125U-1 is formed between domain boundary 127n-1 and a domain boundary 125n-2, which coincides with the upward/downward-facing material interface formed by lower photoresist surface 122L and upper dielectric layer surface 123A2U. Similarly, a lowermost domain boundary 127-0 coincides with lower surface 124A3L of STI structure 124A3, with lowermost domain 125L formed between lowermost domain boundary 127-0 and domain boundary 127m, which coincides with the upward/downward-facing material interface formed by upper surface 123A1U of base substrate 123A1 and lower surface 123A2L of dielectric layer 123A2. Because upper surfaces 124A1U and 124A2U of structures 124A1 and 124A2, respectively, are disposed at different Z-axis locations, domain boundaries 127m+1 and 127m+2 are assigned to the upward/downward-facing material interface formed by these surfaces and corresponding portions of dielectric layer 123A2. Note that domain boundary 127m coincides with the lower surfaces of polysilicon structures 124A1 and 124A2 and the upper surface of STI structure 124A3, so separate domain boundaries are not generated for the upward/downward-facing material interfaces generated by these surfaces.

Referring again to FIG. 1, D-Matrix 250 is then generated (block 230) using domains 125 such that D-Matrix 250 provides a total reflected electric field $\tilde{B}^{top}$ generated in response to a modeled incident electric field $\tilde{F}^{top}$ that is directed vertically onto modeled inhomogeneous substrate 121 (e.g., directed through photoresist layer 122 in the negative Z-axis direction). As indicated by the arrows in FIG. 1, D-Matrix 250 is then utilized by model-based correction tool 300, which simulates wave propagation (block 310) based on a known light source 301 and an optical system 303 that model incident light passing through a preliminary mask pattern 172 and onto a modeled substrate 130 including a photoresist layer 132 disposed over a substrate 131, whereby patterned incident light 305FP is directed onto exposed portions 134A of photoresist layer 132, while incident light is prevented from reaching shaded portions 134B of photoresist layer 132. Model-based correction tool 300 utilizes the wave propagation process and D-Matrix 250 to compute light intensities inside photoresist layer (block 320), and then generates modifications to the initial mask design (if needed) based on the computed light intensities according to known techniques (block 330). A final mask design 175 is the passed to mask fabrication tool 400 for generation of a physical mask 177 that is then utilized by IC fabrication system 500 to generate IC chip 150A. In one embodiment, light source 301 and optical system 303 utilized by model-based correction tool 300 model actual light source 501 and actual optical system of IC fabrication system 500, whereby focused patterned light 505FP is accurately modeled by model-based correction tool 300, resulting in exposure pattern 154 formed in actual photoresist layer 152 formed on substrate 501, which is a physical implementation of inhomogeneous substrate 101 of IC design 100.

FIG. 2 includes additional details explaining D-Matrix generation (block 230), and includes also includes additional details regarding mask modification using the generated D-Matrix. As indicated at the top of box 230 in FIG. 2, D-Matrix generation 230 begins by selecting a domain d for processing (block 231). Next, Fourier-space representations are utilized to determine discrete electrical field components and discrete magnetic field components at the top and bottom domain boundaries of selected domain d (block 232). The discrete field components are then numerically integrated to obtain a corresponding domain-specific matrix $M^d$ for selected domain d (block 232), and then a domain transfer matrix $T^d$ is generated for selected domain d based on the corresponding domain-specific matrix $M^d$. As indicated by the loop formed between blocks 231 and 237, a domain transfer matrix $T^d$ is generated for the selected domain d, and then a next domain is selected (NO branch from decision block 237) until all domains have been processed. When all domains have been processed (YES branch from decision block 237), the transfer matrices generated for all of the domains are multiplied together to generate a total transfer matrix $T^{wafer}$ (block 238), and then the total transfer matrix $T^{wafer}$ is utilized to calculate the D-Matrix (block 239). The above-mentioned steps utilized to generate the D-Matrix are implemented in one embodiment utilizing the equations and additional details set forth below.

Referring to block 232, for selected domain d, Fourier-space representations are utilized to determine electrical field components and discrete magnetic field components at the horizontal top and bottom domain boundaries. In accordance with one embodiment, a fast method for solving Maxwell's equations includes utilizing a coordinate system in which the Z-axis is aligned with the main direction of the incident light. The following equations (1) are derived from Maxwell's curl equations and underpin the coupled-domains method:

$$\frac{d\tilde{E}_x}{dz} = i\frac{\omega}{c}\tilde{\mu} * \tilde{H}_y - k_x \frac{c}{\omega}\mathcal{F}\left[\frac{1}{\varepsilon}\left(\frac{\partial H_y}{\partial x} - \frac{\partial H_x}{\partial y}\right)\right]$$ (1)

$$\frac{d\tilde{E}_y}{dz} = -i\frac{\omega}{c}\tilde{\mu} * \tilde{H}_x - k_y \frac{c}{\omega}\mathcal{F}\left[\frac{1}{\varepsilon}\left(\frac{\partial H_y}{\partial x} - \frac{\partial H_x}{\partial y}\right)\right]$$

$$\frac{d\tilde{H}_x}{dz} = -i\frac{\omega}{c}\tilde{\varepsilon} * \tilde{E}_y + k_x \frac{c}{\omega}\mathcal{F}\left[\frac{1}{\mu}\left(\frac{\partial E_y}{\partial x} - \frac{\partial E_x}{\partial y}\right)\right]$$

$$\frac{d\tilde{H}_y}{dz} = i\frac{\omega}{c}\tilde{\varepsilon} * \tilde{E}_x + k_y \frac{c}{\omega}\mathcal{F}\left[\frac{1}{\mu}\left(\frac{\partial E_y}{\partial x} - \frac{\partial E_x}{\partial y}\right)\right]$$

The symbols $E_x$, $E_y$, $H_x$, and $H_y$ in Equations (1) denote the transverse electric and magnetic field components, respectively, $\omega$ is angular frequency, c is free-space wave velocity, $\varepsilon$ is substrate permittivity, and $\mu$ is substrate permeability. The symbol "i" is utilized as known in the art to denote the imaginary unit. The symbol $\mathcal{F}$ denotes a Fourier transform with respect to x and y, a symbol marked by a tilde ($\tilde{q}$) denotes a Fourier-transformed quantity, and $k_x$, $k_y$ are Fourier-space coordinates. Equations (1) may be used to relate the transverse field components in one X-Y plane to the transverse field components in another X-Y plane. An advantage provided by using a Fourier-space representation of the field components is that this approach allows for a more compact numerical representation, because the incident field's transverse components are band-limited by the imaging system.

In one embodiment, to derive a numerical algorithm, the field components $\tilde{E}(k_x, k_y, z)$, etc., are represented discretely at a finite number of points, $(k_{x_m}, k_{y_n})$, $-M \leq m, n \leq M$, equidistantly spaced in Fourier space. The range of frequencies from which the points $(k_{x_m}, k_{y_n})$ are chosen should be larger than the band-limit of the incident wave to have a budget for additional frequency components added by optical scattering. Next the material functions $\tilde{\varepsilon}$ and $\tilde{\mu}$ need to be determined for the chosen frequency points, i.e., $\tilde{\varepsilon}_{m,n} = \tilde{\varepsilon}(k_{x_m}, k_{y_n})$, $\tilde{\mu}_{m,n} = \tilde{\mu}(k_{x_m}, k_{y_n})$.

With these ingredients equations (2) for the discrete field components $\tilde{E}_{x,m,n}(z) = \tilde{E}_x(k_x, k_y, z)$ etc. follow from equations (1):

$$\frac{d\tilde{E}_{x,m,n}}{dz} = i\frac{\omega}{c}\{\tilde{\mu} * \tilde{H}_y\}_{m,n} - k_{x_m}\frac{c}{\omega}\left\{DFT\left[\frac{1}{\varepsilon}\left(\frac{\partial H_y}{\partial x} - \frac{\partial H_x}{\partial y}\right)\right]\right\}_{m,n}$$ (2)

$$\frac{d\tilde{E}_{y,m,n}}{dz} = -i\frac{\omega}{c}\{\tilde{\mu} * \tilde{H}_x\}_{m,n} - k_{y_n}\frac{c}{\omega}\left\{DFT\left[\frac{1}{\varepsilon}\left(\frac{\partial H_y}{\partial x} - \frac{\partial H_x}{\partial y}\right)\right]\right\}_{m,n}$$

$$\frac{d\tilde{H}_{x,m,n}}{dz} = -i\frac{\omega}{c}\{\tilde{\varepsilon} * \tilde{E}_y\}_{m,n} + k_{x_m}\frac{c}{\omega}\left\{DFT\left[\frac{1}{\mu}\left(\frac{\partial E_y}{\partial x} - \frac{\partial E_x}{\partial y}\right)\right]\right\}_{m,n}$$

$$\frac{d\tilde{H}_{y,m,n}}{dz} = i\frac{\omega}{c}\{\tilde{\varepsilon} * \tilde{E}_x\}_{m,n} + k_{y_n}\frac{c}{\omega}\left\{DFT\left[\frac{1}{\mu}\left(\frac{\partial E_y}{\partial x} - \frac{\partial E_x}{\partial y}\right)\right]\right\}_{m,n}$$

All quantities occurring in equations (2) are discrete, '*' denotes discrete convolution and a discrete Fourier transform (DFT) takes the place of the Fourier transform $\mathcal{F}$ in equations (1). Finally, in this embodiment, equations (2) are numerically integrated for a selected domain d to obtain a corresponding domain-specific matrix $M^d$ for domain d (block 234).

Figure 4:
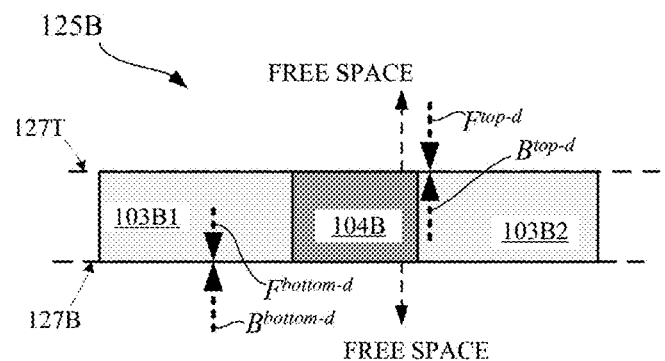
FIG. 4 is a simplified representation showing an exemplary domain during processing by the coupled-domains method of the present invention.

Next, a domain transfer matrix $T^d$ is generated for the selected domain d using the corresponding domain-specific matrix $M^d$ (block 236) such that the resulting domain transfer matrix $T^d$ defines, as indicated in FIG. 4, a first pair of forward and backward propagating wave values $F^{top,d}$ and $B^{top,d}$ occurring at the horizontal top domain boundary 127T of selected domain d in response to a corresponding second pair of forward and backward propagating wave values $F^{bottom,d}$ and $B^{bottom,d}$ simultaneously occurring at the horizontal bottom boundary surface 127B of selected domain d (i.e., the first pair of backward propagating waves $F^{top,d}$ and $B^{top,d}$ are calculated as a function defined by the associated domain transfer matrix $T^d$ and known second pair wave values $F^{bottom,d}$ and $B^{bottom,d}$). According to one embodiment, this process involves solving equations (2) by numerical integration to obtain a domain-specific matrix $M^d$ that relates the discrete field components at the top of selected domain d to the discrete field components at the bottom of selected domain d. Each step of the numerical integration requires two DFTs per transverse field component. In one embodiment, per the numerical integration, non-horizontal material interfaces (e.g., oblique sidewalls) occurring inside the domain are effectively approximated by stair-step functions (as described below with reference to FIG. 5). Numerical integration of equations (2) results in a domain-specific matrix $M^d$ for the selected domain. From each domain-specific matrix $M^d$ a new domain transfer matrix $T^d = R^{-1}M^dR$ is constructed, which relates the transverse electric field components of a pair $(\tilde{F}^{top,d}, \tilde{B}^{top,d})$ of forward and backward propagating waves at the top of selected domain d to the transverse components of a pair $(\tilde{F}^{bottom,d}, \tilde{B}^{bottom,d})$ of forward and backward propagating waves at the bottom of the selected domain d, $$\begin{pmatrix} \tilde{F}^{bottom,d} \\ \tilde{B}^{bottom,d} \end{pmatrix} = T^d \begin{pmatrix} \tilde{F}^{top,d} \\ \tilde{B}^{top,d} \end{pmatrix} = R^{-1} M^d R \begin{pmatrix} \tilde{F}^{top,d} \\ \tilde{B}^{top,d} \end{pmatrix}. \quad (3)$$

The matrix R in equation (3) serves to convert from a first field representation, in terms of forward and backward propagating electric wave field components, to a second field representation in terms of electric and magnetic components. Likewise, $R^{-1}$ translates from the second to the first field representation. Matrix R is of the block-diagonal form shown in equation (4):

$$R = \begin{bmatrix} \ddots & & & 0 \\ & r_{m,n}^{11} & r_{m,n}^{12} & \\ & r_{m,n}^{21} & r_{m,n}^{22} & \\ 0 & & & \ddots \end{bmatrix}, \quad (1)$$

The non-zero entries $r_{m,n}^{11}$, $r_{m,n}^{12}$, $r_{m,n}^{21}$, and $r_{m,n}^{22}$ in equation (4) are obtained as solutions to equations (2) at the bottom of domain d ($z=z^{bottom,d}$), assuming $\tilde{E}_{x,m,n}^{bottom,d}$, $\tilde{E}_{y,m,n}^{bottom,d}$, $\tilde{H}_{x,m,n}^{bottom,d}$, and $\tilde{H}_{y,m,n}^{bottom,d}$ are of the form shown by equations (5):

$$\tilde{E}_{x,m,n}^{bottom,d} = r_{m,n}^{11} \tilde{F}_{x,m,n}^{bottom,d} \exp(ik_{z,m,n}z) + r_{m,n}^{12} \tilde{B}_{x,m,n}^{bottom,d} \exp(-ik_{z,m,n}z)|_{z=z^{bottom,d}}$$

$$\tilde{E}_{y,m,n}^{bottom,d} = r_{m,n}^{11} \tilde{F}_{y,m,n}^{bottom,d} \exp(ik_{z,m,n}z) + r_{m,n}^{12} \tilde{B}_{y,m,n}^{bottom,d} \exp(-ik_{z,m,n}z)|_{z=z^{bottom,d}}$$

$$\tilde{H}_{x,m,n}^{bottom,d} = r_{m,n}^{21} \tilde{F}_{x,m,n}^{bottom,d} \exp(ik_{z,m,n}z) + r_{m,n}^{22} \tilde{B}_{x,m,n}^{bottom,d} \exp(-ik_{z,m,n}z)|_{z=z^{bottom,d}}$$

$$\tilde{H}_{y,m,n}^{bottom,d} = r_{m,n}^{21} \tilde{F}_{y,m,n}^{bottom,d} \exp(ik_{z,m,n}z) + r_{m,n}^{22} \tilde{B}_{y,m,n}^{bottom,d} \exp(-ik_{z,m,n}z)|_{z=z^{bottom,d}} \quad (5)$$

Equations (5) are matching the transverse field components at the bottom of a selected domain d with plane-wave optical modes occurring in free space (as indicated in FIG. 4), which may be sorted into forward and backward propagating modes. Of course, the scattering problem under consideration does not feature domains surrounded by free space.

After all domains are processed, the transfer matrices $T^d$ of all of the domains are multiplied together to generate a total transfer matrix $T^{wafer}$ (block 238 in FIG. 2) and then the total transfer matrix $T^{wafer}$ is utilized to determine the total disturbance matrix D (block 239). In one embodiment, introducing domain matrices $T^d$ to describe the scattering effect of a single domain allows one to relate incident (forward propagating) and reflected (backward propagating) fields at the wafer top to those at the substrate bottom, as indicated by equation (6):

$$\begin{pmatrix} \tilde{F}^{bottom} \\ \tilde{B}^{bottom} \end{pmatrix} = \prod_d T^d \begin{pmatrix} \tilde{F}^{top} \\ \tilde{B}^{top} \end{pmatrix} = T^{wafer} \begin{pmatrix} \tilde{F}^{top} \\ \tilde{B}^{top} \end{pmatrix}. \quad (6)$$

Because $\tilde{B}^{bottom}=0$ (i.e., no reflection from below the lowest interface), equation (6) can be used to determine the total disturbance matrix D. Specifically, identifying submatrices of $$T^{wafer}, \, T^{wafer} = \begin{pmatrix} T_{11} & T_{12} \\ T_{21} & T_{22} \end{pmatrix},$$

equation (6) may be written as the two equations $$\tilde{F}^{bottom} = T_{11}\tilde{F}^{top} + T_{12}\tilde{B}^{top}$$

$$\tilde{B}^{bottom} = T_{21}\tilde{F}^{top} + T_{22}\tilde{B}^{top}$$

the second of which may be solved for $\tilde{B}^{top}$, which in turn results in equation (7):

$$\tilde{B}^{top} = -T_{22}^{-1} T_{21} \tilde{F}^{top} = \tilde{F}^{top}, \quad (7)$$

which in turn indicates that total disturbance matrix $D = -T_{22}^{-1} T_{21}$.

Referring again to FIGS. 1 and 2, D-Matrix 250 is generated using the coupled-domains method detailed above is in a form that may be utilized by a model-based mask correction tool 300 (or other fast simulator) to determine light intensity values generated in a modeled photoresist layer 132 subjected to light patterned by an initial mask design 172 (which is stored, e.g., with IC design 100). As indicated in the loop provided in block 300 of FIG. 2, the process steps performed by model-based mask correction tool 300 (i.e., determining a patterned electric field incident on the inhomogeneous substrate/wafer (block 310A), computing all electric fields reflected from the inhomogeneous substrate/wafer using D-Matrix 250 (block 310B), and using the incident and reflected light to compute light intensities inside the photoresist layer (block 320)) are formed one or more times until acceptable light intensities are determined (NO branch from decision block 330A). Note that, if a current mask design does not produce acceptable light intensity results, then modifications are made to the mask design (block 330B), and process steps 310A, 310B and 320 are repeated until an acceptable final mask design is generated. Note also that the process steps performed during model-based mask correction (i.e., process steps 310A, 310B and 320) require less computational effort than those required to generate D-matrix using coupled-domains method 200. Further, as indicated by the decision block 330A and modify mask block 330B, a photomask design is generated iteratively, where the iteration is driven by a measure of error between the simulated mask design pattern and a target mask design pattern. That is, an initial mask design is submitted to the model-based mask correction tool, which then calculates light intensity in the photoresist layer based on the initial mask design. The calculated light intensity values are then analyzed to determine if correction of the mask may be needed (e.g., due to undesirable exposure of critical regions of the photoresist). If so, modifications (corrections) are made to the mask design, and the modified mask design is submitted to the model-based mask correction tool, which then recalculates light intensities in the photoresist layer based on the modified mask design. In the course of such a mask-correction loop, the input mask design will change in each iteration, whereas the input layouts concerning the inhomogeneous substrate and photoresist layer will remain unchanged. As such, the D-Matrix 250 is generated once by the coupled-domains method, and remains unchanged during the mask correction loop. Once a suitable mask design is achieved, the final modified design is passed to a mask fabrication tool for generation of a physical mask, which is then utilized during IC fabrication of an IC device based on the IC design. Again, for purposes of simplifying the description provided herein, the IC design described with reference to the coupled-domains method is actually an incomplete (partial) IC design that describes the IC device only at a certain point during the IC fabrication process, and that a complete IC design is required to produce a completed (functional) IC device.

Alternative embodiments and additional features and context associated with the coupled-domains method are provided below with reference to FIGS. 5-9.

Figure 5:
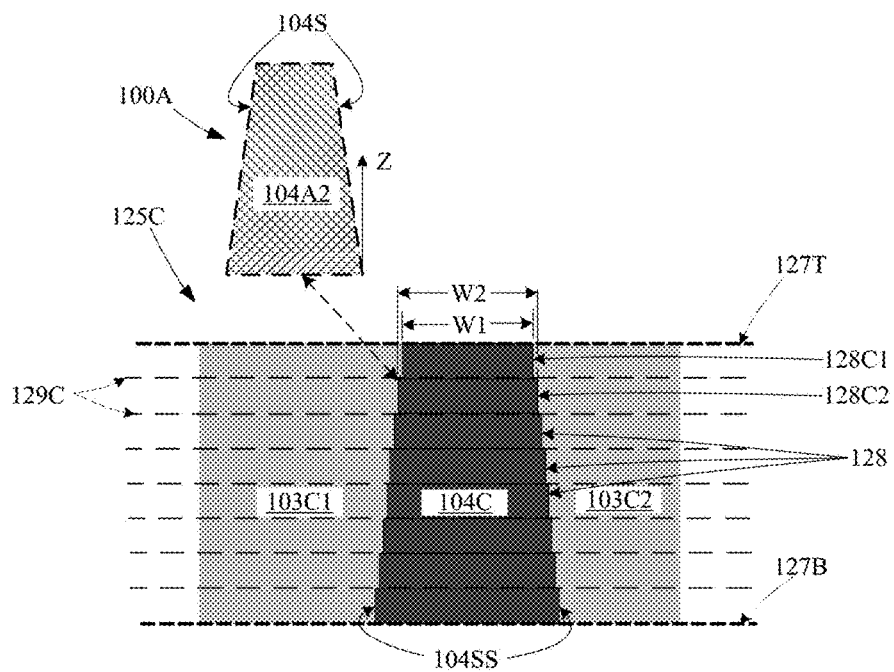
FIG. 5 illustrates an exemplary structure of the IC design, and in particular depicts effective approximation of oblique side surfaces of the structure using a stair-step function.

FIG. 5 illustrates how the coupled-domains method is modified in accordance with an embodiment to effectively approximate the presence of oblique (slanted) material interfaces (i.e., with respect the Z-axis), such as slanted side surfaces 104S of structure 104A2 (also shown in FIG. 3). To approximate the optical effect of slanted side surfaces 104S, a corresponding domain 125C is generated with a corresponding structure 104C in which the slanted side surfaces 104S of structure 104A2 are approximated (modeled) using a number of slabs 128 separated by horizontal boundaries 129C and having sequentially larger widths (i.e., as measured from top to bottom) such that the descending slabs (e.g., from slab 128C1 having width W1 to 128C2 having slightly larger width W2) form a series of stair steps 104SS, where the number of stair slabs/steps is selected using a stair-step function to minimize both computational effort and error. Specifically, domain 125C models the oblique material interface of structure 104C as a series of vertical and horizontal material interfaces between layer material portions 103C1 and 103C2 and side surfaces of structure 104C. This stair-step function technique is known by those skilled in the art, where it is used to analyze the diffraction from surface relief grating structures, and involves dividing the grating into a large number of sufficiently thin planar grating slabs to approximate the grating profile to an arbitrary degree of accuracy.

Because full-chip simulation often presents too much information to be processed in a practical manner, it is customary in mask synthesis applications to partition an IC design geometrically into sub-regions (chip areas) of a size that is feasible to solve with contemporary hardware. Because the fields components in equations (1) and (2) are represented using periodic basis functions, the reflected field $B^{top}$ computed by equation (7) is the solution of the scattering problem with periodic boundary conditions. Periodic boundary conditions, however, do not match with the reality of a larger, non-periodic scattering substrate. To address this problem, a solution familiar to those skilled in the art is utilized that consists of choosing mutually overlapping computational domains, and using only part of the sub-problem solutions for assembling the solution to the original problem. This approach is described in additional detail below with reference to FIGS. 6A and 6B.

Figure 6B:
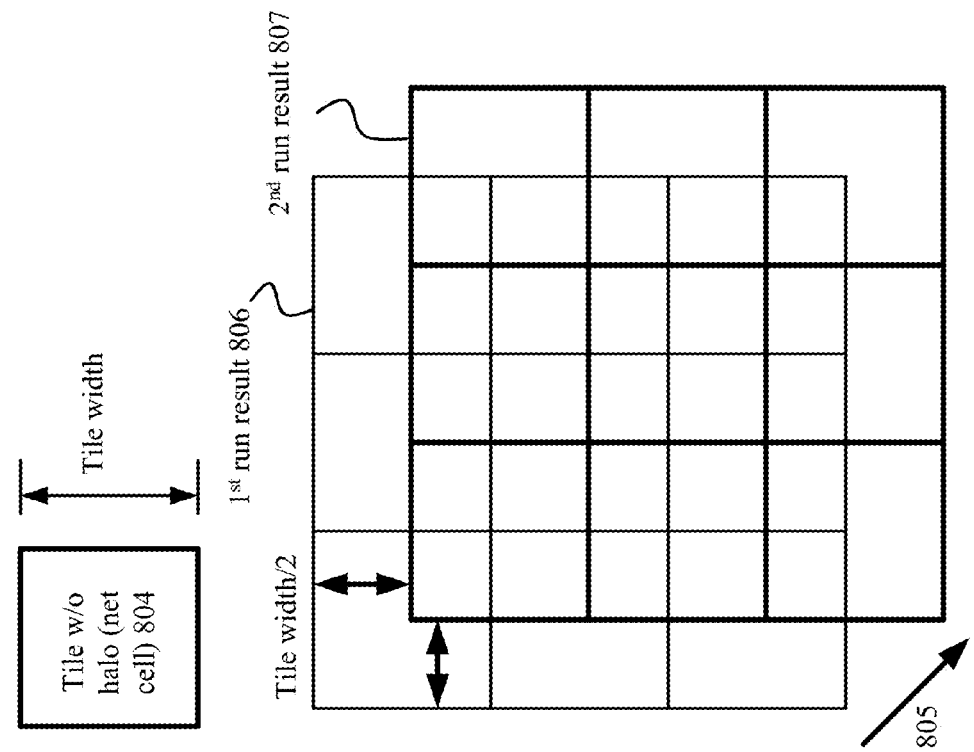
FIGS. 6A and 6B are simplified top views illustrating two exemplary synthesis processes that can be used to generate a large or a full-chip result.
Figure 6A:
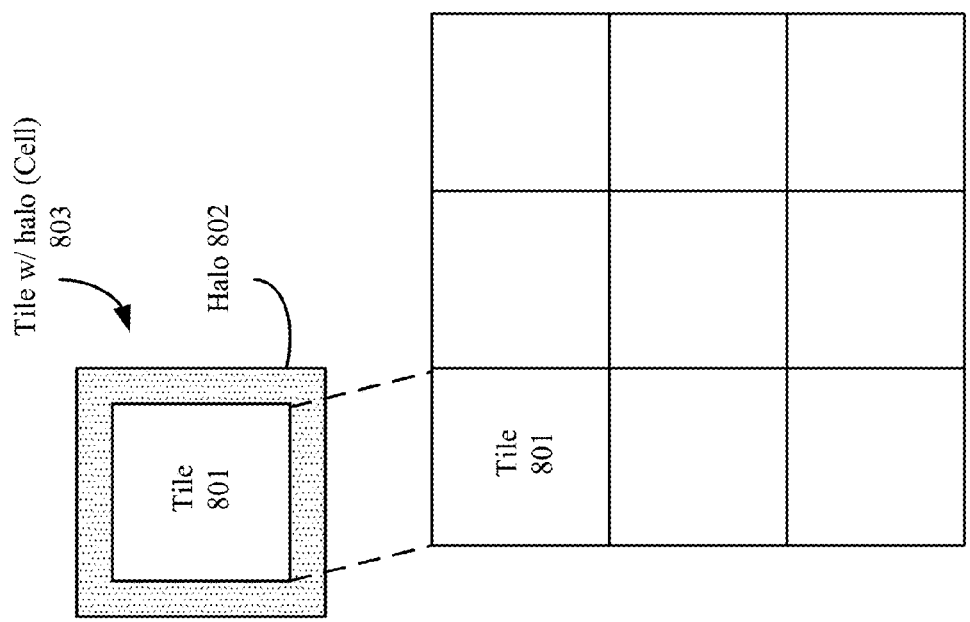

FIGS. 6A and 6B are two tiling techniques that can combine partial results to generate a large/full chip region result. In FIG. 6A, the result of each predetermined area (top view), called a "tile" 801, of the layer is computed with a "halo" 802, thereby generating a cell 803. In one embodiment, the combination of cells 803 can be performed by stitching all the internal tiles 801 together with the results in halos 802 removed. In FIG. 6B, the result of each predetermined area (top view), called a tile without halo (net cell) 804, of the layer is computed. In this way, only the central region of each net cell 804 has its result calculated accurately. In one embodiment, the combination of net cells 804 can be performed by stitching all the net cells 804 together to generate the 1st run result 806. To mitigate the inaccuracy at the boundary of each net cell, all the net cell locations are moved by a shift 805 of a Tilewidth/2 distance on both x and y directions. A second computing is performed on all net cells with the new locations; then by stitching, the 2nd run result 807 is generated. By combining/averaging the 1st run result 806 and the 2nd run result 807 together, the final, full region results can be provided. In one embodiment, averaging of two results 806 and 807 may be performed with weights being varied from the center of each net cell 804 to its boundaries. This weighting function is adjusted depending on required accuracy of TPE capturing.

Figure 7:
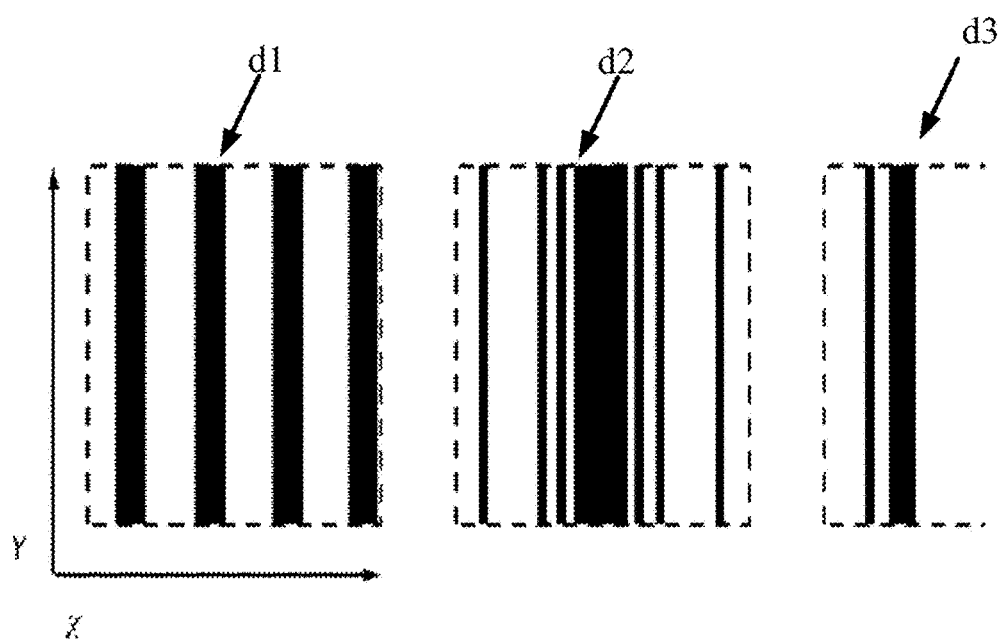
FIG. 7 depicts three exemplary one-dimensional patterns that facilitate a simplified coupled-domains method approach according to an alternative embodiment of the present invention.

FIG. 7 includes three examples of domains d1 to d3, each including structures (indicated by dark lines) consisting of purely one-dimensional line patterns (note that FIG. 7 shows top-down views of domains, whereas FIGS. 1, 3, 4, and 5 show cross-section views of domains). Such one-dimensional features may also appear in the mask design. In a presently preferred embodiment of coupled-domain method, the special case of one-dimensional features extending only in the X-axis direction (i.e., neither substrate nor mask pattern depend on dimensions extending in the Y-axis direction) is addressed by simplifying equations (2) to produce equations (8):

$$\frac{d\tilde{E}_{x,m}}{dz} = i\frac{\omega}{c}\{\tilde{\mu}*\tilde{H}_y\}_m - k_{x_m}\frac{c}{\omega}\left\{DFT\left[\frac{1}{\varepsilon}\left(\frac{\partial H_y}{\partial x}\right)\right]\right\}_m \quad (2)$$

$$\frac{d\tilde{E}_{y,m}}{dz} = -i\frac{\omega}{c}\{\tilde{\mu}*\tilde{H}_x\}_m$$

$$\frac{d\tilde{H}_{x,m}}{dz} = -i\frac{\omega}{c}\{\tilde{\varepsilon}*\tilde{E}_y\}_m + k_{x_m}\frac{c}{\omega}\left\{DFT\left[\frac{1}{\mu}\left(\frac{\partial E_y}{\partial x}\right)\right]\right\}_m$$

$$\frac{d\tilde{H}_{y,m}}{dz} = i\frac{\omega}{c}\{\tilde{\varepsilon}*\tilde{E}_x\}_m$$

The simplification presented by equations (8) greatly reduces the computational effort required for computing disturbance matrix D because the transverse field components are now represented by 2M+1 numbers instead of $(2M+1)^2$ numbers, as in the general method. Equations (2) are a pair of systems of two coupled equations, whereas equations (2) are one system of four coupled equations. Processing time may be reduced further by solving both systems in parallel.

Figure 8:
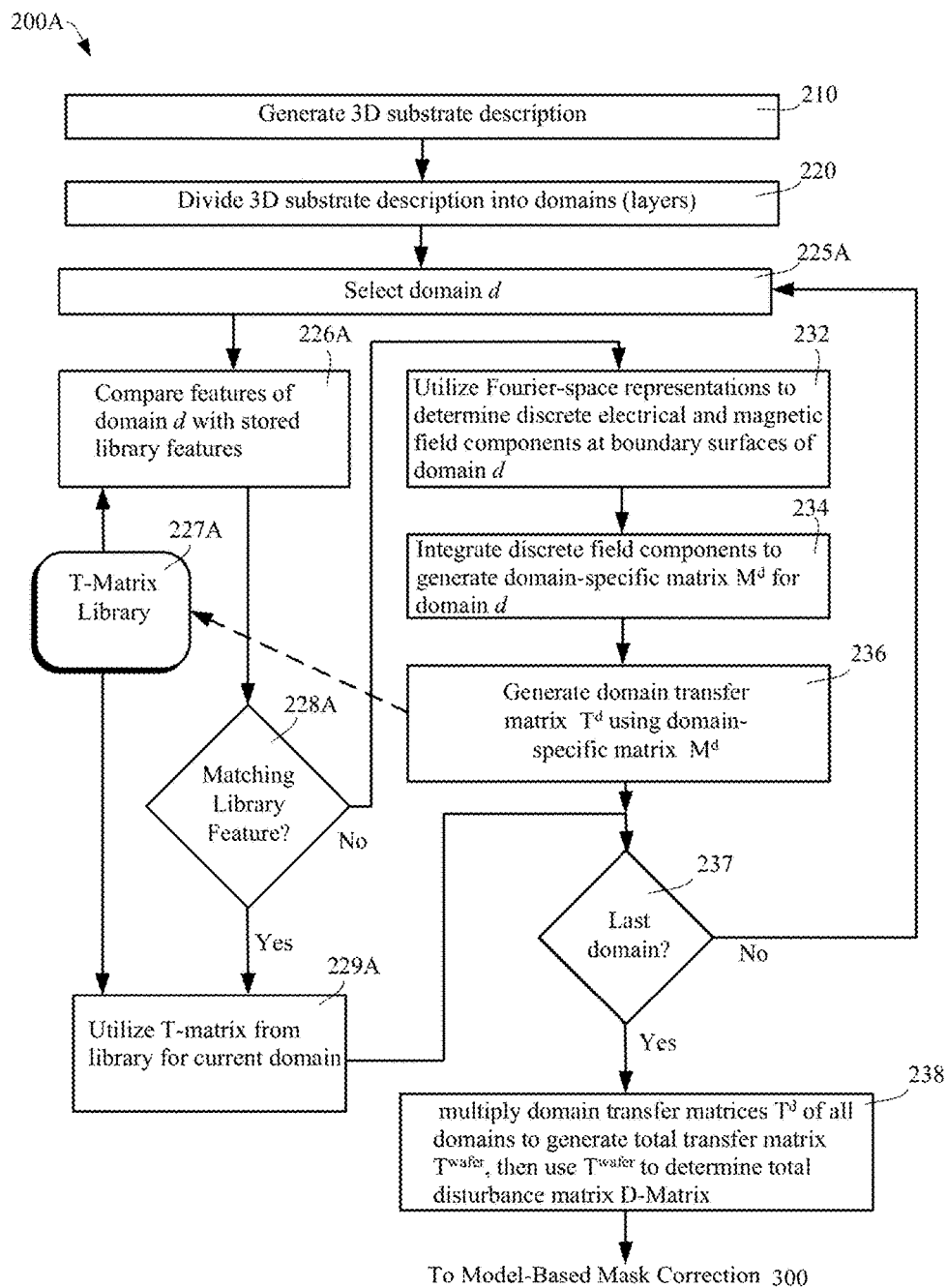
FIG. 8 is a flow diagram depicting a coupled-domains method according to an alternative embodiment of the present invention.

FIG. 8 shows a coupled-domains method 200A according to an alternative embodiment in which the domain transfer matrices $T^d$ generated as mentioned above with reference to block 236 and equation (6) are cached in a library 227A, and utilized in the manner described in related U.S. Pat. No. 8,719,736 (cited above) to further improve processing efficiency. That is, the coupled-domains method is capable of calculating a domain transfer matrix for every possible domain geometric configuration and material composition, and therefore performs as described above with reference to method 200 (FIG. 2) for every domain having a unique geometric configuration and material composition; note that the processes indicated using the same reference numbers both FIG. 2 and FIG. 8 are fully described above with reference to FIG. 2, and are therefore not described in additional detail with reference to FIG. 8. Coupled-domains method 200A differs from the method of FIG. 2 in that it utilizes a previously calculated domain transfer matrix when a currently selected domain has a substantially identical geometric configuration and material composition to that associated with the previously calculated domain transfer matrix, thereby further reducing processing time by way of omitting the domain transfer matrix calculation for each matching currently selected domain.

Referring to block 225A in FIG. 8, after selecting a domain d, method 200A includes comparing the features of selected domain d with features of domains for which domain transfer matrices have already been calculated, which are stored with their associated features in T-Matrix Library 227A. As mentioned in related U.S. Pat. No. 8,719,736 (cited above), a unique key for each domain transfer matrix $T^d$ is derived from the geometry and material composition of its associated domain, and may be re-used (i.e., without requiring calculation using equations (1) to (7) as set forth above) when a subsequent domain includes the same geometry and material composition. As such, when the features of selected domain d match stored domain features (YES branch from block 228A), control passes to block 229A in which the pre-calculated T-matrix TD associated with the matching features is read from T-Matrix Library 227A and utilized for selected domain d (i.e., computation blocks 232, 234 and 236 are bypassed, and control is passed directly to decision block 237). Conversely, when the features of selected domain d do not match stored domain features (NO branch from block 228A), and a domain transfer matrix $T^d$ is calculated for selected domain d using computation blocks 232, 234 and 236. After all domains are processed, total transfer matrix $T^{wafer}$ is computed using the computed or pre-computed domain transfer matrices $T^d$ stored for all domains. Accordingly, to compute total transfer matrix $T^{wafer}$ in this embodiment, only domain transfer matrices $T^d$ that are not found in the T-matrix Library 227A are computed using the coupled-domains methodology embodied in computation blocks 232, 234 and 236. In one embodiment, as indicated by the dashed-line arrow in FIG. 8, domain transfer matrices $T^d$ computed using computation blocks 232, 234 and 236 are both utilized to compute total transfer matrix $T^{wafer}$ and also added to T-Matrix Library for comparison with subsequently processed domains. By combining the use of the coupled-domains method to produce domain transfer functions for unique domain geometries and material configurations, and utilizing pre-computed domain transfer matrix values for domains having previously-encountered or pre-selected domain geometries and material configurations, coupled-domains method 200A provides a faster method for generating disturbance matrices than utilizing coupled-domains method 200 without this modification.

Figure 9:
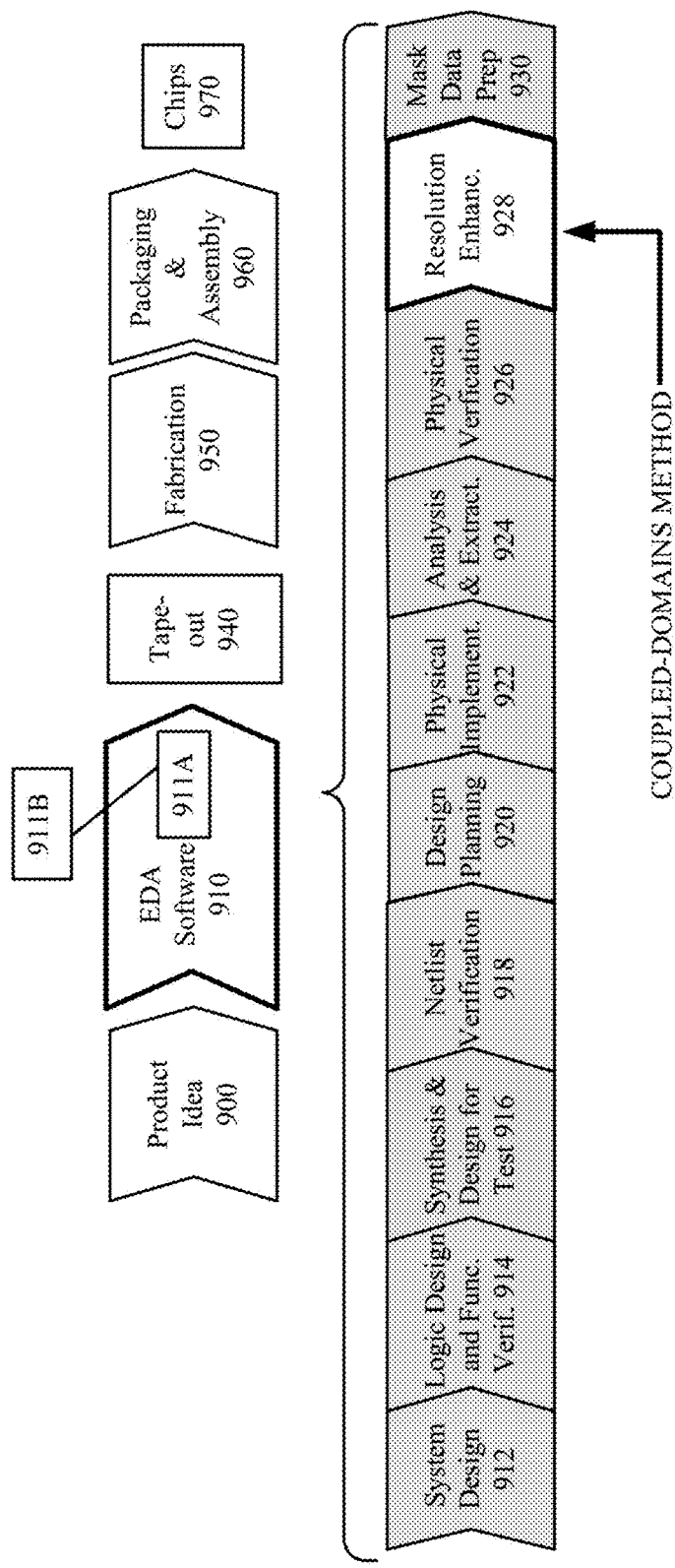
FIG. 9 shows a simplified representation of an exemplary digital IC design flow including the above-described coupled-domains method.
Figure 10:
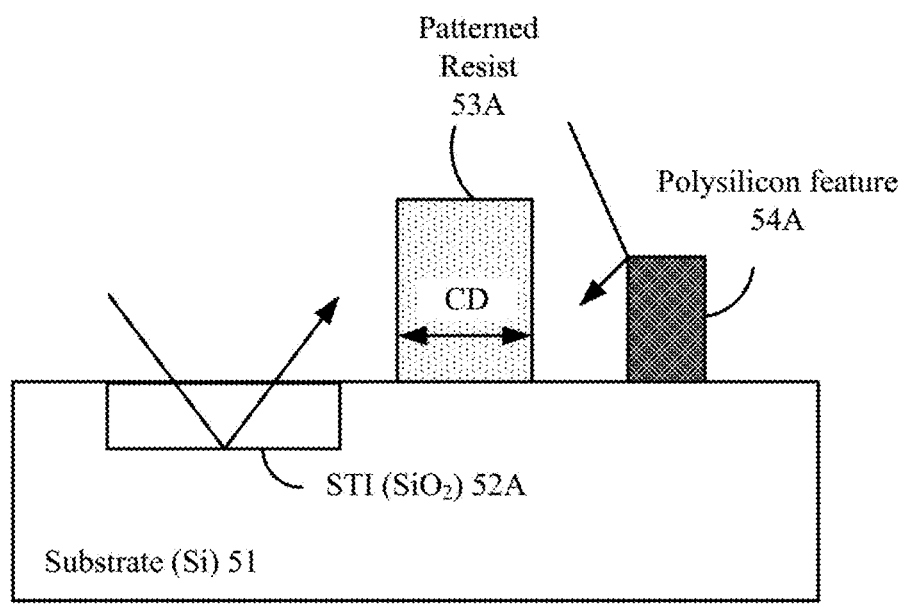
FIG. 10 is a simplified representation showing an exemplary inhomogeneous substrate.

FIG. 9 shows a simplified representation of an exemplary digital IC design flow including the above-described D-matrix synthesis technique. At a high level, the process starts with the product idea (step 900) and is realized in an EDA software design process (step 910). When the design is finalized, it can be taped-out (event 940). After tape out, the fabrication process (step 950) and packaging and assembly processes (step 960) occur resulting, ultimately, in finished chips (result 970).

The EDA software design process (step 910) is actually composed of a number of steps 912-930, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC.

A brief description of the components/steps of the EDA software design process (step 910) will now be provided. In one embodiment, one or more steps of the EDA software design process can be implemented using a computer-readable medium 911A, which is read by a computer 911B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 912): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 914): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 918): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 920): Here, an overall floorplan for the chip is constructed and analyzed for timing and top-level routing. Exemplary EDA software products from Synopsys, Inc. that can be used at this step include Astro™ and IC Compiler™ products.

Physical implementation (step 922): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 924): At this step, the circuit function is verified at a transistor level, this in turn permits what-if refinement. Exemplary EDA software products from Synopsys, Inc. that can be used at this step include Astro-Rail™, PrimeRail™, Primetime®, and Star RC/XT™ products.

Physical verification (step 926): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 928): This step involves geometric manipulations of the layout to improve manufacturability of the design. Exemplary EDA software products from Synopsys, Inc. that can be used at this step include Proteus™, ProteusAF™, and PSMGen™ products. In one embodiment, the above-described coupled-domains method can be performed in step 928.

Mask data preparation (step 930): This step provides the "tape-out" data for production of masks for lithographic use to produce finished chips. Exemplary EDA software products from Synopsys, Inc. that can be used at this step include the CATS® family of products.

The coupled-domains method described above can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

The invention claimed is:

1. A method for generating a disturbance matrix that describes E-field disturbances generated by optical properties of an inhomogeneous substrate defined by an integrated circuit (IC) design, said inhomogeneous substrate including a plurality of materials forming a plurality of layers and a plurality of structures disposed in said layers, wherein said generated disturbance matrix is configured for utilization by a model-based mask correction tool configured generate a modified mask design for use in the subsequent production of a physical mask that is used during fabrication of an integrated circuit device based on the IC design, the method including:

generating a three-dimensional (3D) substrate description based on the IC design, said 3D substrate description including a modeled inhomogeneous substrate generated in accordance with said inhomogeneous substrate such that all upward/downward-facing material interfaces formed between said pluralities of layers and structures of said inhomogeneous substrate are defined by corresponding planar horizontal interfaces between corresponding modeled layers and modeled structures of said modeled inhomogeneous substrate;

dividing the 3D substrate description into a plurality of vertically arranged domains separated by horizontal planar domain boundaries, each said domain defined by optical properties of one or more materials of said plurality of materials corresponding to at least one of a corresponding said modeled structure and a corresponding said modeled layer disposed in said each domain; and generating said disturbance matrix such that said disturbance matrix provides a total reflected electric field generated in response to a modeled incident electric field that is directed onto said modeled inhomogeneous substrate, wherein generating the disturbance matrix comprises:

utilizing Fourier-space representations to determine discrete electrical field components and discrete magnetic field components at the top domain boundary and the bottom domain boundary of at least one said domain;

numerically integrating the discrete electrical field components and discrete magnetic field components of said each domain to obtain a corresponding domain-specific matrix for said at least one domain;

generating a domain transfer matrix for said at least one domain based on said corresponding domain-specific matrix such that each said domain transfer matrix defines a first pair of forward and backward propagating wave values occurring at the top domain boundary of said at least one domain in response to a corresponding second pair of forward and backward propagating wave values simultaneously occurring at the bottom domain boundary of said at least one domain;

multiplying the transfer matrices of all of the plurality of domains to generate a total transfer matrix; and utilizing the total transfer matrix to determine said disturbance matrix.

2. The method of claim 1, wherein generating the three-dimensional (3D) substrate description further comprises generating a modeled photoresist layer over said modeled inhomogeneous substrate, wherein dividing the 3D substrate description into said plurality of vertically arranged domains comprises forming an uppermost domain having a corresponding top domain boundary defined by an upper surface of said modeled photoresist layer, said dividing the 3D substrate description being performed such that a corresponding said domain boundary coincides with each said planar horizontal interface of said 3D substrate description, and wherein generating said disturbance matrix comprises providing a function for calculating said total reflected electric field in response to said modeled incident electric field directed onto said corresponding top domain boundary of said uppermost domain.

3. The method of claim 1, wherein utilizing Fourier-space representations to determine said discrete electrical field components and said discrete magnetic field components comprises utilizing the equations:

$$\frac{d\tilde{E}_x}{dz} = i\frac{\omega}{c}\tilde{\mu} * \tilde{H}_y - k_x \frac{c}{\omega}\mathcal{F}\left[\frac{1}{\varepsilon}\left(\frac{\partial H_y}{\partial x} - \frac{\partial H_x}{\partial y}\right)\right] \quad (1)$$

$$\frac{d\tilde{E}_y}{dz} = -i\frac{\omega}{c}\tilde{\mu} * \tilde{H}_x - k_y \frac{c}{\omega}\mathcal{F}\left[\frac{1}{\varepsilon}\left(\frac{\partial H_y}{\partial x} - \frac{\partial H_x}{\partial y}\right)\right]$$

-continued $$\frac{d\tilde{H}_x}{dz} = -i\frac{\omega}{c}\tilde{\varepsilon}*\tilde{E}_y + k_x\frac{c}{\omega}\mathcal{F}\left[\frac{1}{\mu}\left(\frac{\partial E_y}{\partial x} - \frac{\partial E_x}{\partial y}\right)\right]$$

$$\frac{d\tilde{H}_y}{dz} = i\frac{\omega}{c}\tilde{\varepsilon}*\tilde{E}_x + k_y\frac{c}{\omega}\mathcal{F}\left[\frac{1}{\mu}\left(\frac{\partial E_y}{\partial x} - \frac{\partial E_x}{\partial y}\right)\right]$$

wherein $E_x$, $E_y$, $H_x$, and $H_y$ denote the transverse electric field components and magnetic field components, respectively, $\omega$ is angular frequency, c is free-space wave velocity, $\varepsilon$ is substrate permittivity, and $\mu$ is substrate permeability, the symbol $\mathcal{F}$ denotes a Fourier transform with respect to x and y, symbols marked by a tilde ~ denote Fourier-transformed quantities, and $k_x$, $k_y$ are Fourier-space coordinates.

4. The method of claim 3, wherein numerically integrating the discrete electrical field components and discrete magnetic field components comprises utilizing the equations:

$$\frac{d\tilde{E}_{x,m,n}}{dz} = i\frac{\omega}{c}\{\tilde{\mu}*\tilde{H}_y\}_{m,n} - k_{x_m}\frac{c}{\omega}\left\{DFT\left[\frac{1}{\varepsilon}\left(\frac{\partial H_y}{\partial x} - \frac{\partial H_x}{\partial y}\right)\right]\right\}_{m,n}$$

$$\frac{d\tilde{E}_{y,m,n}}{dz} = -i\frac{\omega}{c}\{\tilde{\mu}*\tilde{H}_x\}_{m,n} - k_{y_n}\frac{c}{\omega}\left\{DFT\left[\frac{1}{\varepsilon}\left(\frac{\partial H_y}{\partial x} - \frac{\partial H_x}{\partial y}\right)\right]\right\}_{m,n}$$

$$\frac{d\tilde{H}_{x,m,n}}{dz} = -i\frac{\omega}{c}\{\tilde{\varepsilon}*\tilde{E}_y\}_{m,n} + k_{x_m}\frac{c}{\omega}\left\{DFT\left[\frac{1}{\mu}\left(\frac{\partial E_y}{\partial x} - \frac{\partial E_x}{\partial y}\right)\right]\right\}_{m,n}$$

$$\frac{d\tilde{H}_{y,m,n}}{dz} = i\frac{\omega}{c}\{\tilde{\varepsilon}*\tilde{E}_x\}_{m,n} + k_{y_n}\frac{c}{\omega}\left\{DFT\left[\frac{1}{\mu}\left(\frac{\partial E_y}{\partial x} - \frac{\partial E_x}{\partial y}\right)\right]\right\}_{m,n}$$

where '*' denotes discrete convolution, and "DFT" denotes a discrete Fourier transform that takes the place of the Fourier transform $\mathcal{F}$ of equations (1).

5. The method of claim 3, wherein numerically integrating the discrete electrical field components and discrete magnetic field components comprises utilizing the equations:

$$\frac{d\tilde{E}_{x,m}}{dz} = i\frac{\omega}{c}\{\tilde{\mu}*\tilde{H}_y\}_m - k_{x_m}\frac{c}{\omega}\left\{DFT\left[\frac{1}{\varepsilon}\left(\frac{\partial H_y}{\partial x}\right)\right]\right\}_m$$

$$\frac{d\tilde{E}_{y,m}}{dz} = -i\frac{\omega}{c}\{\tilde{\mu}*\tilde{H}_x\}_m$$

$$\frac{d\tilde{H}_{x,m}}{dz} = -i\frac{\omega}{c}\{\tilde{\varepsilon}*\tilde{E}_y\}_m + k_{x_m}\frac{c}{\omega}\left\{DFT\left[\frac{1}{\mu}\left(\frac{\partial E_y}{\partial x}\right)\right]\right\}_m$$

$$\frac{d\tilde{H}_{y,m}}{dz} = i\frac{\omega}{c}\{\tilde{\varepsilon}*\tilde{E}_x\}_m$$

where '*' denotes discrete convolution, and "DFT" denotes a discrete Fourier transform that takes the place of the Fourier transform $\mathcal{F}$ of equations (1).

6. The method of claim 4, wherein generating a domain transfer matrix $T^d$ for said each domain d using said corresponding domain-specific matrix $M^d$ comprises generating said first and second pairs of forward and backward propagating waves using the equation:

$$\begin{pmatrix}\tilde{F}^{bottom,d}\\ \tilde{B}^{bottom,d}\end{pmatrix} = T^d\begin{pmatrix}\tilde{F}^{top,d}\\ \tilde{B}^{top,d}\end{pmatrix} = R^{-1}M^d R\begin{pmatrix}\tilde{F}^{top,d}\\ \tilde{B}^{top,d}\end{pmatrix}$$

wherein $\tilde{F}^{top,d}$ and $\tilde{B}^{top,d}$ form the first pair of forward and backward propagating waves, respectively, $\tilde{F}^{bottom,d}$ and $\tilde{B}^{bottom,d}$ form the second pair of forward and backward propagating waves, respectively, $T^d$ is the domain transfer matrix for said each domain d, $M^d$ is the domain-specific matrix for said each domain d, and R is a block-diagonal matrix with 2×2 blocks as shown by the equation:

$$R = \begin{bmatrix}\ddots & & 0\\ & r_{m,n}^{11} & r_{m,n}^{12} & \\ & r_{m,n}^{21} & r_{m,n}^{22} & \\ 0 & & & \ddots\end{bmatrix}, \quad (4)$$

where the non-zero values in equation (4) are obtained from finding solutions to equations (2), at the bottom of said each domain d, of the form:

$$\tilde{E}_{x,m,n}^{bottom,d} = r_{m,n}^{11}\tilde{F}_{x,m,n}^{bottom,d}\exp(ik_{z,m,n}z) + r_{m,n}^{12}\tilde{B}_{x,m,n}^{bottom,d}\exp(-ik_{z,m,n}z)|_{z=z_{bottom,d}}$$

$$\tilde{E}_{y,m,n}^{bottom,d} = r_{m,n}^{11}\tilde{F}_{y,m,n}^{bottom,d}\exp(ik_{z,m,n}z) + r_{m,n}^{12}\tilde{B}_{y,m,n}^{bottom,d}\exp(-ik_{z,m,n}z)|_{z=z_{bottom,d}}$$

$$\tilde{H}_{x,m,n}^{bottom,d} = r_{m,n}^{21}\tilde{F}_{x,m,n}^{bottom,d}\exp(ik_{z,m,n}z) + r_{m,n}^{22}\tilde{B}_{x,m,n}^{bottom,d}\exp(-ik_{z,m,n}z)|_{z=z_{bottom,d}}$$

$$\tilde{H}_{y,m,n}^{bottom,d} = r_{m,n}^{21}\tilde{F}_{y,m,n}^{bottom,d}\exp(ik_{z,m,n}z) + r_{m,n}^{22}\tilde{B}_{y,m,n}^{bottom,d}\exp(-ik_{z,m,n}z)|_{z=z_{bottom,d}} \quad (2)$$

and wherein $\tilde{E}_{x,m,n}^{bottom,d}$, $\tilde{E}_{y,m,n}^{bottom,d}$, $\tilde{H}_{x,m,n}^{bottom,d}$, and $\tilde{H}_{y,m,n}^{bottom,d}$ match said transverse field components at the bottom of said each domain d with plane-wave optical modes occurring in free space.

7. The method of claim 6, wherein multiplying the transfer matrices and determining the disturbance matrix comprises utilizing equation (6) to determine the total transfer matrix $T^{wafer}$:

$$\begin{pmatrix}\tilde{F}^{bottom}\\ \tilde{B}^{bottom}\end{pmatrix} = \prod_d T^d\begin{pmatrix}\tilde{F}^{top}\\ \tilde{B}^{top}\end{pmatrix} = T^{wafer}\begin{pmatrix}\tilde{F}^{top}\\ \tilde{B}^{top}\end{pmatrix}. \quad (3)$$

where $\tilde{F}^{top}$ and $\tilde{B}^{top}$ are the total incident electric field and the total reflected electric field at the upper photoresist surface, respectively, $\tilde{F}^{bottom}$ and $\tilde{B}^{bottom}$ are the forward propagating electric field and the backward propagating electric field at the lowest domain boundary, respectively, $T^d$ represents the domain transfer matrices for each domain d, and $T^{wafer}$ is the total transfer matrix;

identifying submatrices $T_{11}$, $T_{12}$, $T_{21}$, and $T_{22}$ of the total transfer matrix $$T^{wafer}, T^{wafer} = \begin{pmatrix}T_{11} & T_{12}\\ T_{21} & T_{22}\end{pmatrix},$$

to find equation $$\tilde{B}^{bottom} = T_{21}\tilde{F}^{top} + T_{22}\tilde{B}^{top},$$

and determining the disturbance matrix D using the condition $\tilde{B}^{bottom}=0$:

$$\tilde{B}^{top}=-T_{22}^{-1}T_{21}\tilde{F}^{top}=\tilde{F}^{top} \quad (4)$$

where the disturbance matrix is equal to $-T_{22}^{-1}T_{21}$.

8. The method of claim 1, further comprising dividing the 3D substrate description into a plurality of tiles, and generating a corresponding said disturbance matrix for each said tile.

9. The method of claim 1, wherein said utilizing Fourier-space representations, said numerically integrating and said generating said domain transfer matrix are performed for every domain of said plurality of domains.

10. The method of claim 1, further comprising, after dividing the 3D substrate description into said plurality of vertically arranged domains:
  selecting a domain for processing;
  comparing a first geometry and material composition of said selected domain to second geometry and material compositions stored in a library;
  when said first geometry and material composition of said selected domain match one of said second geometry and material compositions, utilizing a pre-computed domain transfer matrix stored in said library and then selecting a next domain for processing.

11. The method of claim 10, further comprising, when said first geometry and material composition of said selected domain fails to match one of said second geometry and material compositions, utilizing said Fourier-space representations and said numerically integrating to generate said corresponding domain-specific matrix for said selected domain, and generating a new domain transfer matrix for said selected domain based on said corresponding domain-specific matrix, and storing said first geometry and material composition and said new domain transfer matrix in said library.

12. A method for calculating light intensity values generated in a photoresist layer disposed over an inhomogeneous substrate in response to patterned incident light passed through a modeled mask configured in accordance with a mask design, said inhomogeneous substrate including a plurality of materials forming a plurality of layers and a plurality of structures disposed in said layers, wherein said calculated light intensity values are configured for utilization by a model-based mask correction tool configured generate a modified mask design for use in the subsequent production of a physical mask that is used during fabrication of an integrated circuit device based on the IC design, the method comprising:
  generating a disturbance matrix such that said disturbance matrix provides a total reflected electric field generated at an upper photoresist surface of said photoresist layer in response to an incident electric field directed onto said inhomogeneous substrate;
  simulating wave propagation in the photoresist layer in response to said patterned incident light; and
  calculating said light intensity values using said disturbance matrix and said simulated wave propagation,
  wherein generating the disturbance matrix comprises:
  generating a three-dimensional (3D) substrate description including said inhomogeneous substrate and said photoresist layer;
  dividing the 3D substrate description into a plurality of vertically arranged domains separated by horizontal planar domain boundaries, each said domain defined by optical properties of one or more materials of said plurality of materials corresponding to at least one of a corresponding said modeled structure and a corresponding said modeled layer disposed in said each domain;
  utilizing Fourier-space representations to determine discrete electrical field components and discrete magnetic field components at the top domain boundary and the bottom domain boundary of at least one of said domains;
  numerically integrating the discrete electrical field components and discrete magnetic field components of said each domain to obtain a corresponding domain-specific matrix for said at least one domain;
  generating a domain transfer matrix for said at least one domain based on said corresponding domain-specific matrix such that each said domain transfer matrix defines a first pair of forward and backward propagating wave values occurring at the top domain boundary of said at least one domain in response to a corresponding second pair of forward and backward propagating wave values simultaneously occurring at the bottom domain boundary of said at least one domain;
  multiplying the transfer matrices of all of the plurality of domains to generate a total transfer matrix; and
  utilizing the total transfer matrix to determine said disturbance matrix.

13. A non-transitory, computer-readable medium storing computer-executable instructions for generating a disturbance matrix that describes E-field disturbances generated by optical properties of an inhomogeneous substrate defined by an integrated circuit (IC) design, said inhomogeneous substrate including a plurality of materials forming a plurality of layers and a plurality of structures disposed in said layers, wherein said generated disturbance matrix is configured for utilization by a model-based mask correction tool configured generate a modified mask design for use in the subsequent production of a physical mask that is used during fabrication of an integrated circuit device based on the IC design, the instructions when executed by a processor cause the processor to execute a process comprising:
  generating a three-dimensional (3D) substrate description based on the IC design, said 3D substrate description including a modeled inhomogeneous substrate generated in accordance with said inhomogeneous substrate such that all upward/downward-facing material interfaces formed between said pluralities of layers and structures of said inhomogeneous substrate are defined by corresponding planar horizontal interfaces between corresponding modeled layers and modeled structures of said modeled inhomogeneous substrate;
  dividing the 3D substrate description into a plurality of vertically arranged domains separated by horizontal planar domain boundaries, each said domain defined by optical properties of one or more materials of said plurality of materials corresponding to at least one of a corresponding said modeled structure and a corresponding said modeled layer disposed in said each domain; and
  generating said disturbance matrix such that said disturbance matrix provides a total reflected electric field generated in response to a modeled incident electric field that is directed onto said modeled inhomogeneous substrate, wherein generating the disturbance matrix comprises:
  utilizing Fourier-space representations to determine discrete electrical field components and discrete magnetic field components at the top domain boundary and the bottom domain boundary of at least one said domain;

numerically integrating the discrete electrical field components and discrete magnetic field components of said each domain to obtain a corresponding domain-specific matrix for said at least one domain;

generating a domain transfer matrix for said at least one domain based on said corresponding domain-specific matrix such that each said domain transfer matrix defines a first pair of forward and backward propagating wave values occurring at the top domain boundary of said at least one domain in response to a corresponding second pair of forward and backward propagating wave values simultaneously occurring at the bottom domain boundary of said at least one domain;

multiplying the transfer matrices of all of the plurality of domains to generate a total transfer matrix; and utilizing the total transfer matrix to determine said disturbance matrix.

* * * * *